(12) United States Patent
Jeon et al.

(10) Patent No.: US 12,402,504 B2
(45) Date of Patent: Aug. 26, 2025

(54) ORGANIC LIGHT EMITTING DISPLAY DEVICE INCLUDING TRANSPARENT REGION AND MANUFACTURING METHOD THEREOF

(71) Applicant: Samsung Display Co., Ltd., Yongin-Si (KR)

(72) Inventors: Woo-Sik Jeon, Hwaseong-si (KR); Dong-Gyu Kim, Yongin-si (KR); Sung-Chul Kim, Seongnam-si (KR); Ok-Keun Song, Hwaseong-si (KR); Sung-Soo Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 112 days.

(21) Appl. No.: 17/465,042

(22) Filed: Sep. 2, 2021

(65) Prior Publication Data

US 2021/0399075 A1 Dec. 23, 2021

Related U.S. Application Data

(63) Continuation of application No. 15/370,495, filed on Dec. 6, 2016, now abandoned.

(30) Foreign Application Priority Data

Jan. 13, 2016 (KR) .................. 10-2016-0004067

(51) Int. Cl.
*H10K 59/121* (2023.01)
*H10K 50/11* (2023.01)
(Continued)

(52) U.S. Cl.
CPC ......... *H10K 59/1213* (2023.02); *H10K 50/11* (2023.02); *H10K 50/805* (2023.02);
(Continued)

(58) Field of Classification Search
CPC ............ H01L 27/3262; H01L 27/3213; H01L 27/3246; H01L 27/326; H01L 51/5012;
(Continued)

(56) References Cited

U.S. PATENT DOCUMENTS 9,245,934 B2 1/2016 Chung et al.
2004/0113545 A1 6/2004 Pang et al.
(Continued)

FOREIGN PATENT DOCUMENTS

JP H11329745 A 11/1999
JP 2008277269 A 11/2008
(Continued)

OTHER PUBLICATIONS

Chinese Office Action for Application No. 201710018333.0 dated Oct. 19, 2022.

*Primary Examiner* — Eric W Jones
(74) *Attorney, Agent, or Firm* — CANTOR COLBURN LLP

(57) ABSTRACT

An organic light emitting display device includes a substrate including a sub-pixel region and a transparent region, a first semiconductor element in the sub-pixel region on the substrate, a second semiconductor element overlapping at least a portion of the sub-pixel region on the substrate, and is spaced apart from the first semiconductor element, a first lower electrode disposed in the sub-pixel region on the first semiconductor element and electrically connected to the first semiconductor element, a second lower electrode disposed in the transparent region on the substrate and electrically connected to the second semiconductor element, a first light emitting layer on the first lower electrode, a second light emitting layer on the second lower electrode, and an upper electrode on the first and second light emitting layers where
(Continued)

second lower electrode has a thickness that is less than a thickness of the first lower electrode, and transmits a light.

20 Claims, 10 Drawing Sheets

(51) Int. Cl.
*H10K 50/805* (2023.01)
*H10K 50/84* (2023.01)
*H10K 59/122* (2023.01)
*H10K 59/35* (2023.01)
*H10K 102/00* (2023.01)

(52) U.S. Cl.
CPC ........... *H10K 50/84* (2023.02); *H10K 59/121* (2023.02); *H10K 59/122* (2023.02); *H10K 59/351* (2023.02); *H10K 2102/3031* (2023.02)

(58) Field of Classification Search
CPC ............. H01L 51/5203; H01L 51/5237; H01L 2251/5323; H10K 59/1213; H10K 59/122; H10K 59/351; H10K 59/121; H10K 50/84; H10K 50/805; H10K 50/11; H10K 2102/3031
USPC ..................................................... 257/40, 59
See application file for complete search history.

(56) References Cited

U.S. PATENT DOCUMENTS

| | | | |
|---|---|---|---|
| 2005/0110403 A1* | 5/2005 | Han | H10K 59/128 |
| | | | 313/512 |
| 2005/0225238 A1 | 10/2005 | Yamazaki | |
| 2005/0264184 A1 | 12/2005 | Park et al. | |
| 2008/0111475 A1* | 5/2008 | Baek | H10K 59/121 |
| | | | 257/E27.111 |
| 2009/0250244 A1* | 10/2009 | Tsuda | G02F 1/13439 |
| | | | 216/13 |
| 2010/0315318 A1* | 12/2010 | Lee | H10K 59/131 |
| | | | 345/76 |
| 2011/0148944 A1 | 6/2011 | Kobayashi | |
| 2012/0168755 A1 | 7/2012 | Choi | |
| 2013/0113843 A1 | 5/2013 | Yamazaki | |
| 2013/0187131 A1 | 7/2013 | Chung et al. | |
| 2015/0048999 A1 | 2/2015 | Hsieh | |
| 2015/0069371 A1* | 3/2015 | Yamazaki | H10K 50/80 |
| | | | 257/40 |
| 2017/0271415 A1 | 9/2017 | Yamazaki | |

FOREIGN PATENT DOCUMENTS

| | | |
|---|---|---|
| KR | 1020110095653 A | 8/2011 |
| KR | 1020130049727 A | 5/2013 |
| KR | 1020140017420 A | 2/2014 |
| KR | 1020150019885 A | 2/2015 |

* cited by examiner

ORGANIC LIGHT EMITTING DISPLAY DEVICE INCLUDING TRANSPARENT REGION AND MANUFACTURING METHOD THEREOF

This application is a continuation of U.S. patent application Ser. No. 15/370,495, filed on Dec. 6, 2016, which claims priority to Korean Patent Applications No. 10-2016-0004067, filed on Jan. 13, 2016, and all the benefits accruing therefrom under 35 U.S.C. § 119, the content of which in its entirety is herein incorporated by reference.

BACKGROUND

1. Field

Exemplary embodiments relate generally to organic light emitting display devices. More particularly, exemplary embodiments of the invention relate to organic light emitting display devices including a transparent region.

2. Description of the Related Art

A flat panel display ("FPD") device is widely used as a display device of an electronic device due to various advantages such as a lightweight and a thinness compared to a cathode-ray tube ("CRT") display device. Typical examples of the FPD device include a liquid crystal display ("LCD") device and an organic light emitting display ("OLED") device. Compared to the LCD device, the OLED device has many advantages such as a higher luminance and a wider viewing angle. In addition, the OLED device is made thinner because a backlight is not desired in the OLED device. In the OLED device, electrons and holes are injected into an organic thin layer through a cathode and an anode, and then recombined in the organic thin layer to generate excitons, thereby a light of a certain wavelength is emitted.

SUMMARY

Recently, a transparent organic light emitting display ("OLED") device transmitting an image of an object or a target that is located in the back or the rear of the OLED device by including a transparent region has been developed. Here, since the OLED device includes the transparent region, an opening ratio of pixels may be relatively reduced. In addition, since the transparent region of the OLED device only performs a function transmitting a light, the OLED device may operate in a high luminance mode such that a quality of a displaying image of the OLED device having the reduced opening ratio is implemented as a quality of a displaying image of a conventional OLED device. As a result, a life time of the pixels of the OLED device may be relatively rapidly reduced, and a consumption of an electrical power of the OLED device may be increased.

Exemplary embodiments provide an organic light emitting display device including a light emitting layer in a transparent region.

According to exemplary embodiments, an OLED device includes a substrate, a first semiconductor element, a second semiconductor element, a first lower electrode, a second lower electrode, a first light emitting layer, a second light emitting layer, and an upper electrode. The substrate includes a sub-pixel region and a transparent region. The first semiconductor element is disposed in the sub-pixel region on the substrate. The second semiconductor element overlaps at least a portion of the sub-pixel region on the substrate, and is spaced apart from the first semiconductor element. The first lower electrode is disposed in the sub-pixel region on the first semiconductor element, and is electrically connected to the first semiconductor element. The second lower electrode is disposed in the transparent region on the substrate, and is electrically connected to the second semiconductor element. The second lower electrode has a thickness that is less than a thickness of the first lower electrode, and transmits a light. The first light emitting layer is disposed on the first lower electrode. The second light emitting layer is disposed on the second lower electrode. The upper electrode is disposed on the first and second light emitting layers.

In exemplary embodiments, the first semiconductor element may include a first active layer, a first gate electrode, a first source electrode, and a first drain electrode. The first active layer may be disposed in the sub-pixel region on the substrate. The first gate electrode may be disposed on the first active layer. The first source electrode may contact a first portion of the first active layer, and may be disposed on the first gate electrode. The first drain electrode may contact a second portion of the first active layer, and may be on the first gate electrode.

In exemplary embodiments, the second semiconductor element may include a second active layer, a second gate electrode, a second source electrode, and a second drain electrode. The second active layer may be disposed on the substrate. The second gate electrode may be disposed on the second active layer. The second source electrode may contact a first portion of the second active layer, and may be disposed on the second gate electrode. The second drain electrode may contact a second portion of the second active layer, and may be disposed on the second gate electrode. A portion of the second semiconductor element may overlap the transparent region.

In exemplary embodiments, the second light emitting layer includes an organic emission layer, and at least a portion of the second semiconductor element may overlap the organic emission layer of the second light emitting layer.

In exemplary embodiments, the second light emitting layer includes an organic emission layer, and the second semiconductor element may not overlap the organic emission layer of the second light emitting layer.

In exemplary embodiments, the second portion of the second active layer may overlap the transparent region, and the second drain electrode may be disposed in the transparent region.

In exemplary embodiments, the OLED device may further include a planarization layer and a pixel defining layer. The planarization layer may be disposed on the first and second semiconductor elements. The pixel defining layer may be disposed on the planarization layer, and may cover both lateral portions of the first lower electrode and both lateral portions of the second lower electrode.

In exemplary embodiments, a first contact hole and a second contact hole may be defined in the planarization layer. The first lower electrode may contact the first drain electrode via the first contact hole, and the second lower electrode may contact the second drain electrode via the second contact hole.

In exemplary embodiments, the second light emitting layer includes an organic emission layer, and the second contact hole may be located under the organic emission layer of the second light emitting layer.

In exemplary embodiments, the second light emitting layer includes an organic emission layer, and the second contact hole may be located under the pixel defining layer such that the second contact hole does not overlap the organic emission layer of the second light emitting layer.

In exemplary embodiments, the first light emitting layer may emit a light in a first direction that is perpendicular to an upper surface of the substrate, and the second light emitting layer may emit a light in a second direction that is opposite to the first direction.

In exemplary embodiments, the first lower electrode may reflect a light that is emitted from the first light emitting layer, and the second lower electrode may transmit a light that is emitted from the second light emitting layer.

In exemplary embodiments, the second light emitting layer may emit a light of a white color.

In exemplary embodiments, when the second semiconductor element is activated, the second light emitting layer may emit a light of a white color. When the second semiconductor element is not activated, an image of an object that is located in the back of the OLED device may be transmitted via the transparent region.

According to exemplary embodiment of exemplary embodiments, an OLED device includes a substrate, a first semiconductor element, a second semiconductor element, a first lower electrode, a second lower electrode, a first light emitting layer, a second light emitting layer, and an upper electrode. The substrate includes a sub-pixel region and a transparent region. The first semiconductor element is disposed in the sub-pixel region on the substrate. The second semiconductor element is disposed in the sub-pixel region on the substrate, and is spaced apart from the first semiconductor element. The first lower electrode is disposed in the sub-pixel region on the first semiconductor element, and is electrically connected to the first semiconductor element. The second lower electrode is disposed in a portion of the sub-pixel region and the transparent region on the substrate, and is electrically connected to the second semiconductor element. The second lower electrode has a thickness that is less than a thickness of the first lower electrode, and transmits a light. The first light emitting layer is disposed on the first lower electrode. The second light emitting layer is disposed on the second lower electrode. The upper electrode is disposed on the first and second light emitting layers.

In exemplary embodiments, the first semiconductor element may include a first active layer, a first gate electrode, a first source electrode, and a first drain electrode. The first active layer may be disposed in the sub-pixel region on the substrate. The first gate electrode may be disposed on the first active layer. The first source electrode may contact a first portion of the first active layer, and may be disposed on the first gate electrode. The first drain electrode may contact a second portion of the first active layer, and may be on the first gate electrode.

In exemplary embodiments, the second semiconductor element may include a second active layer, a second gate electrode, a second source electrode, and a second drain electrode. The second active layer may be disposed on the substrate. The second gate electrode may be disposed on the second active layer. The second source electrode may contact a first portion of the second active layer, and may be disposed on the second gate electrode. The second drain electrode may contact a second portion of the second active layer, and may be disposed on the second gate electrode. A portion of the second semiconductor element may overlap the transparent region.

In exemplary embodiments, the OLED device may further include a planarization layer and a pixel defining layer. The planarization layer may be disposed on the first and second semiconductor elements. The pixel defining layer may be disposed on the planarization layer, and may cover both lateral portions of the first lower electrode and both lateral portions of the second lower electrode. A first contact hole and a second contact hole may be defined in the planarization layer. The first lower electrode may contact the first drain electrode via the first contact hole, and the second lower electrode may contact the second drain electrode via the second contact hole.

In exemplary embodiments, the first and second contact holes may be located in the sub-pixel region.

In exemplary embodiments, the second light emitting layer includes an organic emission layer, and the second contact hole may be located under the pixel defining layer such that the second contact hole does not overlap the organic emission layer of the second light emitting layer.

As the OLED device according to exemplary embodiments includes a light emitting layer in the transparent region, a rapid deterioration of a pixel included in the OLED device 100 may be prevented. In addition, a consumption of an electrical power of the OLED device may be reduced.

BRIEF DESCRIPTION OF THE DRAWINGS

Exemplary embodiments can be understood in more detail from the following description taken in conjunction with the accompanying drawings, in which.

DETAILED DESCRIPTION

Figure 1:
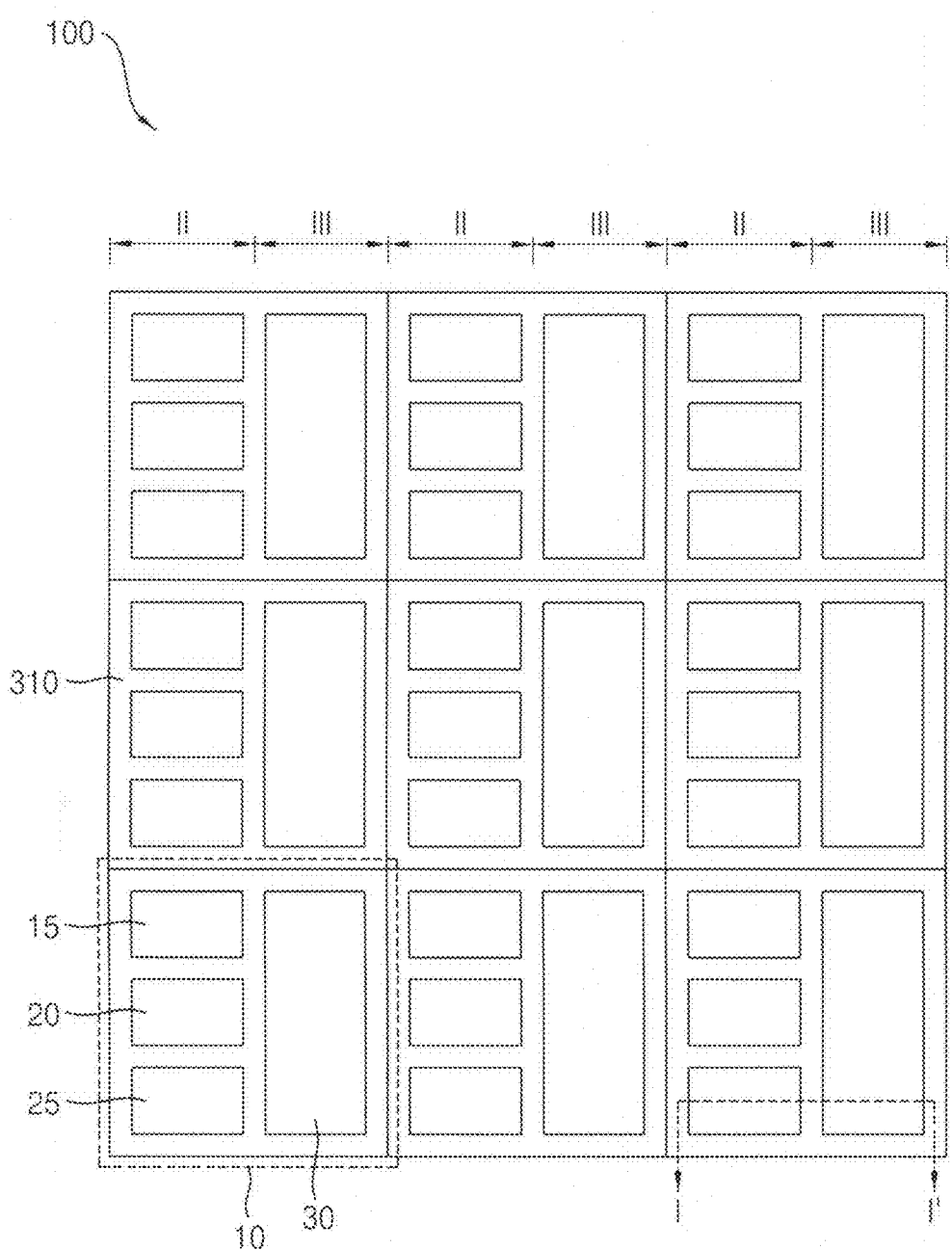
FIG. 1 is a planar view illustrating exemplary embodiments of an organic light emitting display ("OLED") device in accordance with the invention.

Hereinafter, embodiments of the invention will be explained in detail with reference to the accompanying drawings. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a planar view illustrating an organic light emitting display ("OLED") device in accordance with exemplary embodiments.

Referring to FIG. 1, an OLED device 100 may include a plurality of pixel regions. One pixel region 10 may include a sub-pixel region II and a transparent region III.

In the sub-pixel region II, each of first through three sub-pixels 15, 20, and 25 may be disposed. In an exemplary embodiment, the first sub-pixel 15 may emit a light of a red color, and the second sub-pixel 20 may emit a light of a green color, for example. In an exemplary embodiment, the third sub-pixel 25 may emit a light of a blue color, for example. However, the invention is not limited thereto, and the first sub-pixel 15, the second sub-pixel 20 and the third sub-pixel 25 may emit lights of various other colors. The first through three sub-pixels 15, 20, and 25 may substantially surround a pixel defining layer 310.

In the transparent region III, a transparent window may be located. The transparent window may be substantially surrounded by the pixel defining layer 310. A light incident from the outside may be transmitted via the transparent window. In exemplary embodiments, a fourth sub-pixel 30 may be disposed in the transparent region III. A thickness of a lower electrode included in the fourth sub-pixel 30 may be less than that of a lower electrode included in each of the first through third sub-pixels 15, 20, and 25 such that the light is transmitted in the transparent region III. In an exemplary embodiment, the fourth sub-pixel 30 may emit a light of a white color, for example. In an alternative exemplary embodiment, the fourth sub-pixel 30 may emit a light of red color, a light of green color, a light of blue color, etc., for example. Accordingly, in the transparent region III of the OLED device 100, a light may be emitted by the fourth sub-pixel 30.

In exemplary embodiments, one pixel region 10 of the OLED device 100 includes the first through third sub-pixels 15, 20, and 25 and one transparent window 30, but is not limited thereto. In exemplary embodiments, for example, a plurality of pixel regions 10 may be shared with one transparent window 30. In addition, the first through third sub-pixels 15, 20, and 15 are arranged in a first direction (e.g., a vertical direction), but are not limited thereto. In another exemplary embodiment, the first through third sub-pixels 15, 20, and 15 are arranged in a second direction (e.g., a horizontal direction) that is perpendicular to the first direction, for example.

Figure 2:
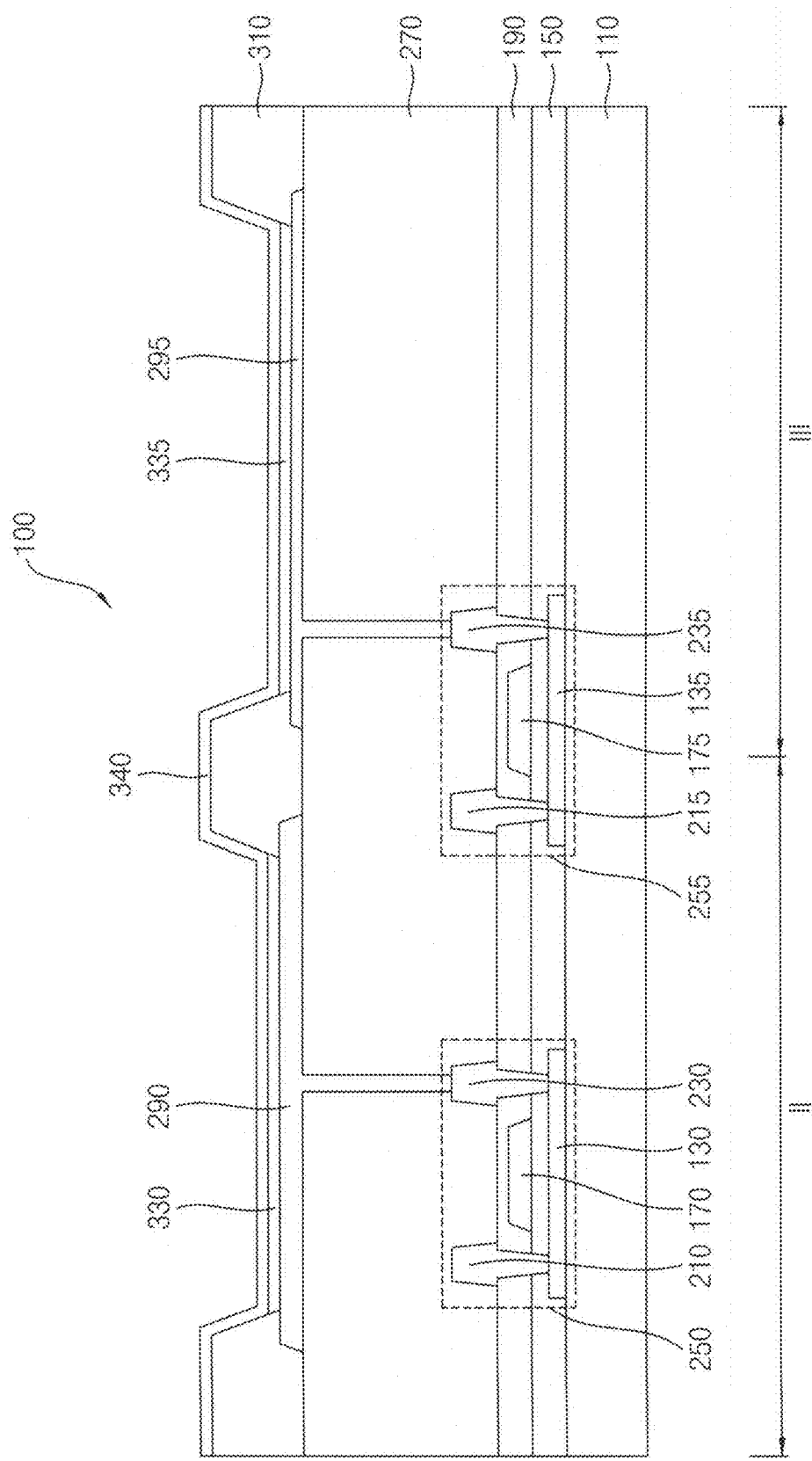
FIG. 2 is a cross-sectional view taken along line I-I' of FIG. 1.
Figure 3:
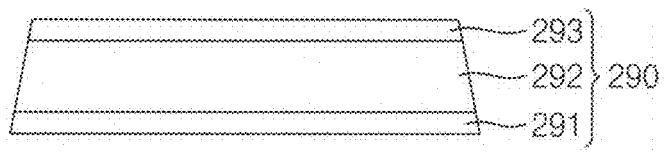
FIG. 3 is a cross-sectional view for describing a first lower electrode illustrated in FIG. 2.
Figure 4:
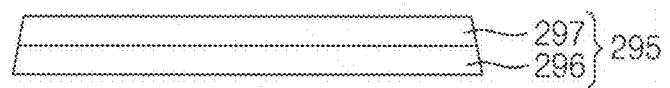
FIG. 4 is a cross-sectional view for describing a second lower electrode illustrated in FIG. 2.

FIG. 2 is a cross-sectional view taken along line I-I' of FIG. 1, and FIG. 3 is a cross-sectional view for describing a first lower electrode illustrated in FIG. 2. FIG. 4 is a cross-sectional view for describing a second lower electrode illustrated in FIG. 2.

Referring to FIGS. 2, 3, and 4, an OLED device 100 may include a substrate 110, a gate insulating layer 150, an insulating interlayer 190, a planarization layer 270, first and second light emitting structures, a pixel defining layer 310, etc. Here, the first and second light emitting structures may include first and second semiconductor elements 250 and 255, first and second lower electrodes 290 and 295, first and second light emitting layers 330 and 335, respectively, and may commonly include an upper electrode 340. The first and second semiconductor elements 250 and 255 may include first and second active layers 130 and 135, first and second gate electrodes 170 and 175, first and second source electrodes 210 and 215, and first and second drain electrodes 230 and 235, respectively.

As described above, the OLED device 100 may include a plurality of pixel regions. One pixel region among a plurality of the pixel regions may include a sub-pixel region II and a transparent region III.

In the sub-pixel region II, the first semiconductor element 250, the first lower electrode 290, the first light emitting layer 330, etc., may be disposed. In the transparent region III, the second lower electrode 295, the second light emitting layer 335, etc., may be disposed. The upper electrode 340 may be entirely disposed in the sub-pixel region II and the transparent region III, and the second semiconductor element 255 may be disposed in a portion of the sub-pixel region II and a portion of the transparent region III. In exemplary embodiments, a portion of the second semiconductor element 255 may overlap the second light emitting layer 335.

A display image may be displayed in the sub-pixel region II, and a light may be emitted by the second light emitting layer 335 in the transparent region III. However, the second light emitting layer 335 and the second lower electrode 295 may be substantially transparent. Accordingly, when the second semiconductor element 255 is not activated (e.g., a turned-off state of the second light emitting layer 335), an image of an object that is located at the back (e.g., in the rear) of the OLED device 100 may be transmitted in the transparent region III. As the OLED device 100 includes the transparent region III, the OLED device 100 may serve as a transparent display device.

The first and second light emitting structures may be disposed on the substrate 110. The substrate 110 may include opaque materials or transparent materials. In an exemplary embodiment, the substrate 110 may include a quartz substrate, a synthetic quartz substrate, a calcium fluoride substrate, a fluoride-doping quartz substrate, a sodalime substrate, a non-alkali substrate etc., for example. In an alternative exemplary embodiment, the substrate 110 may include a flexible transparent material such as a flexible transparent resin substrate (e.g., a polyimide substrate).

In an exemplary embodiment, the polyimide substrate may include a first polyimide layer, a barrier film layer, a second polyimide layer, etc., for example. Since the polyimide substrate is relatively thin and flexible, the polyimide substrate may be disposed on a rigid glass substrate to help support the formation of the light emitting structures. That is, the substrate 110 may have a structure in which the first polyimide layer, the barrier film layer and the second polyimide layer are stacked on the rigid glass substrate. In a manufacturing the OLED device 100, after an insulating layer is provided on the second polyimide layer of the polyimide substrate, the light emitting structures may be disposed on the insulating layer. After the light emitting structures are disposed on the insulating layer, the rigid glass substrate under which the polyimide substrate is disposed may be removed. It may be difficult to directly form the light emitting structures on the polyimide substrate because the polyimide substrate is relatively thin and flexible. Accordingly, the light emitting structures are disposed on the polyimide substrate and the rigid glass substrate, and then the polyimide substrate may serve as the substrate 110 of the OLED device 100 after the removal of the rigid glass substrate. As OLED device 100 includes the sub-pixel region II and the transparent region III, the substrate 110 may be divided into the sub-pixel region II and the transparent region III.

A buffer layer (not shown) may be disposed on the substrate 110. The buffer layer may be interposed between the substrate 110 and the first and second active layers 130 and 135. The buffer layer may be disposed on the entire substrate 110. The buffer layer may prevent the diffusion of metal atoms and/or impurities from the substrate 110. Additionally, the buffer layer may control a rate of a heat transfer in a crystallization process for forming the first and second active layers 130 and 135, thereby obtaining substantially uniform the first and second active layers 130 and 135. Furthermore, the buffer layer may improve a surface flatness of the substrate 110 when a surface of the substrate 110 is relatively uneven. According to a type of the substrate 110, at least two buffer layers may be provided on the substrate 110, or the buffer layer may not be disposed. In an exemplary embodiment, the buffer layer may include silicon oxide, silicon nitride, silicon oxynitride, organic materials, etc., for example.

The first semiconductor element 250 may include the first active layer 130, the first gate electrode 170, the first source electrode 210, and the first drain electrode 230, and may be disposed in the sub-pixel region II on the substrate 110.

In exemplary embodiments, the second semiconductor element 255 may include the second active layer 135, the second gate electrode 175, the second source electrode 215, and the second drain electrode 235, and may be disposed in a portion of the sub-pixel region II and a portion of the transparent region III on the substrate 110. That is, at least a portion of the second semiconductor element 255 may overlap the second light emitting layer 335. In an exemplary embodiment, the second semiconductor element 255 may be disposed under the pixel defining layer 310 that is interposed between the first light emitting layer 330 and the second light emitting layer 335, for example. Here, an external light may be transmitted via the transparent region III. When a transmissivity of the transparent region III included in the OLED device 100 is high, an image of an object that is located at the back of the OLED device 100 may be clearly displayed. Thus, the second semiconductor element 255 capable of reducing a transmissivity in the transparent region III on the substrate 110 should not be overlapped with the transparent region III such that the OLED device 100 has the high transmissivity in the transparent region III. However, since the second semiconductor element 255 is electrically connected to the second lower electrode 295 via a contact hole that is located in the planarization layer 270, at least a portion of the second semiconductor element 255 may be disposed in the transparent region III. That is, at least a portion of the second semiconductor element 255 may overlap the second light emitting layer 335. In addition, as the OLED device 100 includes the second semiconductor element 255, the second light emitting layer 335 may be independently emitted. That is, as the first and second semiconductor elements 250 and 255 may control the first and second light emitting layers 330 and 335, respectively, the first and second light emitting layers 330 and 335 may be simultaneously or independently emitted.

The first and second active layers 130 and 135 may be disposed spacing apart from each other by a predetermined distance on the substrate 110. In an exemplary embodiment, the first active layer 130 may be disposed in the sub-pixel region II, and the second active layer 135 may be disposed in a portion of the sub-pixel region II and a portion of the transparent region III, for example. The first and second active layers 130 and 135 may include an oxide semiconductor, an inorganic semiconductor (e.g., amorphous silicon, polysilicon, etc.), an organic semiconductor, etc.

The gate insulating layer 150 may be disposed on the first and second active layers 130 and 135. The gate insulating layer 150 may cover the first and second active layers 130 in the sub-pixel region II and the transparent region III, and may be disposed on the entire substrate. In exemplary embodiments, the gate insulating layer 150 may sufficiently cover the first and second active layers 130 and 135. The gate insulating layer 150 may include a substantially even surface without a step around the first and second active layers 130 and 135. In an alternative exemplary embodiment, the gate insulating layer 150 may cover the first and second active layers 130 and 135, and may be disposed as a substantially uniform thickness along a profile of the first and second active layers 130 and 135. The gate insulating layer 150 may include a silicon compound, a metal oxide, etc. In an exemplary embodiment, the gate insulating layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc., for example.

Each of the first and second gate electrodes 170 and 175 may be disposed on a portion of the gate insulating layer 150 under which each of the first and second active layers 130 and 135 is disposed to overlap the first and second active layers 130 and 135 in a plan view. In an exemplary embodiment, the first and second gate electrodes 170 and 175 may include a metal, a metal alloy, metal nitride, conductive metal oxide, transparent conductive materials, etc.

The insulating interlayer 190 may be disposed on the first and second gate electrodes 170 and 175. The insulating interlayer 190 may cover the first and second gate electrodes 170 and 175 in the sub-pixel region II and the transparent region III, and may be disposed on the entire substrate 110. In exemplary embodiments, the insulating interlayer 190 may sufficiently cover the first and second gate electrodes 170 and 175. The insulating interlayer 190 may include a substantially even surface without a step around the first and second gate electrodes 170 and 175. In an alternative exemplary embodiment, the insulating interlayer 190 may cover the first and second gate electrodes 170 and 175, and may be disposed as a substantially uniform thickness along a profile of the first and second gate electrodes 170 and 175. The insulating interlayer 190 may include silicon compound, metal oxide, organic materials, etc.

The first and second source electrodes 210 and 215 and the first and second drain electrodes 230 and 235 may be disposed on the insulating interlayer 190. Each of the first and second source electrodes 210 and 215 may contact a first side (e.g., a first portion) of each of the first and second active layers 130 and 135 via a contact hole defined by removing a portion of the gate insulating layer 150 and the insulating interlayer 190. Each of the first and second drain electrodes 230 and 235 may contact a second side (e.g., second portion) of each of the first and second active layers 130 and 135 via a contact hole defined by removing a portion of the gate insulating layer 150 and the insulating interlayer 190. In exemplary embodiments, the second portion of the second active layer 135 may overlap the transparent region III, and the second drain electrode 235 may be disposed in the transparent region III. In an exemplary embodiment, each of the first and second source electrodes 210 and 215 and each of the first and second drain electrodes 230 and 235 may include a metal, an alloy, metal nitride, conductive metal oxide, transparent conductive materials, etc., for example. Accordingly, in the sub-pixel region II, the first semiconductor element 250 including the first active layer 130, the first gate electrode 170, the first source electrode 210, and the first drain electrode 230 may be disposed. In addition, the second semiconductor element 255 including the second active layer 135, the second gate electrode 175, the second source electrode 215, and the second drain electrode 235 may be disposed in a portion of the sub-pixel region II and a portion of the transparent region III. In exemplary embodiments, the semiconductor elements of the OLED device 100 may have a top gate structure, but are not limited thereto. In exemplary embodiments, for example, the semiconductor elements may have a bottom gate structure.

The planarization layer 270 may be disposed on the first and second source electrodes 210 and 215 and the first and second drain electrodes 230 and 235 (e.g., on the first semiconductor element 250 and the second semiconductor element 255). In exemplary embodiments, a first contact hole located in the sub-pixel region II and a second contact hole located in the transparent region III may be defined in the planarization layer 270. In an exemplary embodiment, the first contact hole may be located under the first light emitting layer 330, and the second contact hole may be located under the second light emitting layer 335. The first lower electrode 290 may contact the first drain electrode 230 via the first contact hole, and the second lower electrode 295 may contact the second drain electrode 235 via the second contact hole. The planarization layer 270 may cover the first and second source electrodes 210 and 215 and the first and second drain electrodes 230 and 235 in the sub-pixel region II and the transparent region III, and may be disposed on the entire substrate 110. In exemplary embodiments, the planarization layer 270 may be disposed as a high thickness to sufficiently cover the first and second source and first and second drain electrodes 210, 215, 230, and 235. In this case, the planarization layer 270 may include a substantially flat upper surface, and a planarization process may be further performed on the planarization layer 270 to implement the flat upper surface of the planarization layer 270. In an alternative exemplary embodiment, the planarization layer 270 may cover the first and second source and first and second drain electrodes 210, 215, 230, and 235, and may be disposed as a substantially uniform thickness along a profile of the first and second source and first and second drain electrodes 210, 215, 230, and 235. The planarization layer 270 may include silicon compound, metal oxide, or organic materials, etc.

The first and second lower electrodes 290 and 295 may be disposed on the planarization layer 270. The first lower electrode 290 may be disposed in the sub-pixel region II on the substrate 110, and may have a first thickness. The first lower electrode 290 may contact the first drain electrode 230 by defining the first contact hole of the planarization layer 270. In addition, the first lower electrode 290 may be electrically connected to the first semiconductor element 250. The OLED device 100 may be manufactured as a top emission structure in the sub-pixel region II. Thus, the first lower electrode 290 may include a light reflection layer. In an exemplary embodiment, as illustrated in FIG. 3, the first lower electrode 290 may have a multilayer structure. The multilayer structure may include the first, second, and third electrode layers 291, 292, and 293, for example. The first electrode layer 291 may be disposed in the sub-pixel region II on the planarization layer 270, and the second electrode layer 292 and the third electrode layer 293 may be sequentially disposed on the first electrode layer 291. Here, the first electrode layer 291 and the third electrode layer 293 may include the substantially same materials, and the second electrode layer 292 may be interposed between the first electrode layer 291 and the third electrode layer 293. A thickness of each of the first and third electrode layers 291 and 293 taken along a direction perpendicular to an extension direction of the substrate 110 may be substantially less than that of the second electrode layer 292, and a thickness of the first electrode layer 291 may be substantially the same as that of the third electrode layer 293.

The first electrode layer 291 may cover an uneven upper surface of the planarization layer 270. As the first electrode layer 291 is disposed on the planarization layer 270, the first electrode layer 291 may help the formation of the second electrode layer 292. As the third electrode layer 293 is disposed on the second electrode layer 292, a color coordinate of the OLED device 100 may be readily controlled. The second electrode layer 292 may serve as the light reflection layer. The second electrode layer 292 may reflect a light emitted from the first light emitting layer 330 in the front (e.g., a first direction) of the OLED device 100. Thus, the first lower electrode 290 including the second electrode layer 292 may be substantially opaque. In an alternative exemplary embodiment, the first lower electrode 290 may have a multilayer structure including the first electrode layer 291 and the second electrode layer 292, or may have a single layer structure including the second electrode layer 292. In an exemplary embodiment, the second electrode layer 292 may include gold (Au), silver (Ag), aluminum (Al), platinum (Pt), nickel (Ni), titanium (Ti), palladium (Pd), magnesium (Mg), Calcium (Ca), Lithium (Li), chrome (Cr), tantalum (Ta), tungsten (W), copper (Cu), molybdenum (Mo), scandium (Sc), neodymium (Nd), Iridium (Ir), etc., for example. In an alternative exemplary embodiment, the second electrode layer 292 may include a metal, a metal alloy, metal nitride, conductive metal oxide, etc. In an exemplary embodiment, the second electrode layer 292 may include an alloy of aluminum, aluminum nitride (AlNx), an alloy of silver, tungsten nitride (WNx), an alloy of copper, an alloy of molybdenum, titanium nitride (TiNx), chrome nitride (CrNx), tantalum nitride (TaNx), strontium ruthenium oxide ("SRO"), etc., for example. These may be used alone or in a suitable combination thereof. Each of the first electrode layer 291 and the third electrode layer 293 may be substantially transparent. Each of the first electrode layer 291 and the third electrode layer 293 may include transparent conductive materials, etc. In an exemplary embodiment, each of the first electrode layer 291 and the third electrode layer 293 may include zinc oxide (ZnOx), indium tin oxide ("ITO"), stannum oxide (SnOx), indium oxide (InOx), gallium oxide (GaOx), indium zinc oxide ("IZO"), etc., for example.

The second lower electrode 295 may be disposed in the transparent region III on the substrate 110, and may have a second thickness. The second thickness of the second lower electrode 295 may be less than the first thickness of the first lower electrode 290. The second lower electrode 295 may contact the second drain electrode 235 by defining the second contact hole of the planarization layer 270. In addition, the second lower electrode 295 may be electrically connected to the second semiconductor element 255. To transmit an external light in the transparent region III, the OLED device 100 may be manufactured as a dual emission structure in the transparent region III. That is, the second lower electrode 295 is transparent. In an exemplary embodiment, as illustrated in FIG. 4, the second lower electrode 295 may have a multilayer structure, for example. The multilayer structure may include the fourth and fifth electrode layers 296 and 297. The fourth electrode layer 296 may be disposed in the transparent region III on the planarization layer 270, and the fifth electrode layer 297 may be disposed on the fourth electrode layer 296. Here, the fourth electrode layer 296 and the fifth electrode layer 297 may include the substantially same materials, and a thickness of each of the fourth and fifth electrode layers 296 and 297 may be the substantially same. Each of the fourth and fifth electrode layers 296 and 297 may transmit a light emitted from the second light emitting layer 335. Thus, each of the fourth and fifth electrode layers 296 and 297 may be substantially transparent, and may transmit a light emitted from the second light emitting layer 335 in the back (e.g., a second direction that is opposite to the first direction) of the OLED device 100. In exemplary embodiments, the first electrode layer 291 and the fourth electrode layer 296 may be simultaneously provided, and the third electrode layer 293 and the fifth electrode layer 297 may be simultaneously provided. Thus, the fourth and fifth electrode layers 296 and 297 and the first and third electrode layers 291 and 293 may include the same materials. In an exemplary embodiment, each of the fourth and fifth electrode layers 296 and 297 may include transparent conductive materials, etc. In an alternative exemplary embodiment, the second lower electrode 295 may have a single layer structure including the fourth electrode layer 296 or the fifth electrode layer 297.

Referring again to FIG. 2, the pixel defining layer 310 may expose a portion of each of the first and second lower electrodes 290 and 295 on the planarization layer 270. In an exemplary embodiment, the pixel defining layer 310 may cover both lateral portions of the first lower electrode 290 and both lateral portions of the second lower electrode 295. In this case, the first and second light emitting layers 330 and 335 may be disposed on the portion of each of the first and second lower electrodes 290 and 295 exposed by the pixel defining layer 310. Here, an opening exposing the second lower electrode 295 defined in the transparent region III may be a transparent window of FIG. 1. The pixel defining layer 310 may include organic materials or inorganic materials.

The first light emitting layer 330 (e.g., a light emitting layer included in a third sub-pixel 25 of FIG. 1) may be disposed in a portion where the portion of the first lower electrode 290 is exposed. The first light emitting layer 330 may have a multi-layered structure including an organic emission layer (EL), a hole injection layer (HIL), a hole transfer layer (HTL), an electron transfer layer (ETL), an electron injection layer (EIL), etc. The HIL, the HTL, the EL, the ETL, and the EIL of the first light emitting layer 330 may be sequentially disposed between the first lower electrode 290 and the upper electrode 340. The EL of first light emitting layer 330 may be provided using at least one of light emitting materials capable of generating lights of different colors (e.g., a light of a red color, a light of a blue color, and a light of a green color, etc.) according to first, second, and third sub-pixels 15, 20 and 25 of FIG. 1. Alternatively, the HIL, the HTL, the ETL, the EIL, etc except the EL may be continuously disposed from the display region II to the transparent region III. In an alternative exemplary embodiment, the first light emitting layer 330 may generally generate a light of a white color by stacking a plurality of light emitting materials capable of generating lights of different colors such as a light of a red color, a light of a green color, a light of a blue color, etc. In this case, a color filter may be disposed on the first light emitting layer 330, and may not be disposed in the transparent region III. In an exemplary embodiment, the color filter may include at least one of a red color filter, a green color filter, a blue color filter, for example. In an alternative exemplary embodiment, the color filter may include a yellow color filter, cyan color filter, and magenta color filter, for example. In an exemplary embodiment, the color filter may include a photosensitive resin or a color photoresist, etc., for example.

The second light emitting layer 335 (e.g., a light emitting layer included in a fourth sub-pixel 30 of FIG. 1) may be disposed in a portion where the portion of the second lower electrode 295 is exposed. The second light emitting layer 335 may emit a light of a white color according to fourth sub-pixels of FIG. 1. The second light emitting layer 335 may be controlled by the second semiconductor element 255. In an exemplary embodiment, when the second semiconductor element 255 is activated (e.g., turned-on), the second light emitting layer 335 may emit a light of a white color in the first direction and the second direction. When the second semiconductor element 255 is not activated (e.g., turned-off), an image of an object that is located at the back of the OLED device 100 may be transmitted through the transparent region III. Accordingly, a light may be emitted by the second drain electrode 235 in the transparent region III of the OLED device 100. The second light emitting layer 335 may have a tandem structure to emit a light of a white color. In an exemplary embodiment, the second light emitting layer 335 may include a light emitting layer of a red color, a light emitting layer of a green color, and a light emitting layer of a blue color, for example, and charge generation layers ("CGL") may be interposed between a light emitting layer of the red color and a light emitting layer of the green color and between a light emitting layer of the green color and a light emitting layer of the blue color. In an exemplary embodiment, a light emitting layer of the red color, a first CGL, a light emitting layer of the green color, a second CGL, a light emitting layer of the blue color may be sequentially disposed on the second lower electrode 295. In an alternative exemplary embodiment, the CGL may be disposed between a light emitting layer of the red color and a light emitting layer of the green color or between a light emitting layer of the green color and a light emitting layer of the blue color, for example. In exemplary embodiments, the second light emitting layer 335 may generally generate a light of a white color by mixing a plurality of light emitting materials capable of generating lights of different colors such as a light of a red color, a light of a green color, a light of a blue color, etc. In an exemplary embodiment, the second light emitting layer 335 may generate a light of a blue color and a light of a yellow-green color by using a blue fluorescent material and a yellow-green phosphor material, and a light of a white color may be generated in a suitable mix thereof. In addition, various colors of a light may be generated by controlling a mixing ratio of the light emitting materials. In an exemplary embodiment, the light emitting materials may emit a light of a yellow color, a light of a violet color, a light of a sky-blue color, etc., for example. In an alternative exemplary embodiment, the second light emitting layer 335 may emit a light of a red color, a light of a green color, or a light of a blue color such as the first light emitting layer 330. For example, the second light emitting layer 335 may have a multi-layered structure including EL, HIL, HTL, ETL, EIL, etc. The HIL, the HTL, the EL, the ETL, and the EIL of the second light emitting layer 335 may be sequentially disposed between the second lower electrode 295 and the upper electrode 340. In this case, the HIL, the HTL, the ETL, and the EIL of the first light emitting layer 330 may be continuously disposed from the display region II to the transparent region III.

The upper electrode 340 may be disposed on the pixel defining layer 310 and the first and second light emitting layers 330 and 335. The upper electrode 340 may cover the pixel defining layer 310 and the first and second light emitting layers 330 and 335 in the sub-pixel region II and the transparent region III. That is, the upper electrode 340 may overlap the first and second light emitting layers 330 and 335. In an exemplary embodiment, the upper electrode 340 may include a metal, a metal alloy, metal nitride, conductive metal oxide, transparent conductive materials, etc., for example. These may be used alone or in a suitable combination thereof.

An encapsulation substrate (not shown) may be disposed on the upper electrode 340. The encapsulation substrate and the substrate 110 may include substantially the same materials. In an exemplary embodiment, the encapsulation substrate may include quartz, synthetic quartz, calcium fluoride, fluoride-doping quartz, sodalime glass, non-alkali glass etc., for example. In exemplary embodiments, the encapsulation substrate may include a transparent inorganic material or flexible plastic. In an exemplary embodiment, the encapsulation substrate may include a flexible transparent resin substrate, for example. In this case, to increase flexibility of the OLED device 100, the encapsulation substrate may include a stacked structure where at least one organic layer and at least one inorganic layer are alternately stacked.

The OLED device 100 in accordance with exemplary embodiments includes the second light emitting layer 335 in the transparent region III. Accordingly, a rapid deterioration of a pixel included in the OLED device 100 may be prevented. In addition, as the second light emitting layer 335 emits a light of a white color, a consumption of an electrical power of the OLED device 100 may be reduced.

FIGS. 5, 6, 7, 8, and 9 are cross-sectional views illustrating a method of manufacturing an OLED device in accordance with exemplary embodiments.

Figure 5:
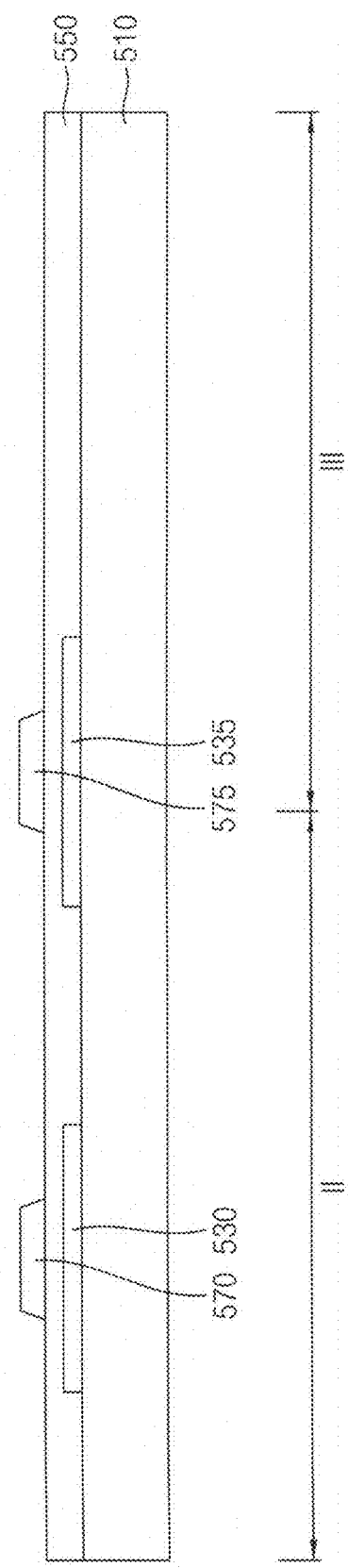
FIGS. 5, 6, 7, 8, and 9 are cross-sectional views illustrating exemplary embodiments of a method of manufacturing an OLED device in accordance with the invention.

Referring to FIG. 5, a first active layer 530 may be provided in a sub-pixel region II on the substrate 510, and a second active layer 530 may be provided in a portion of each of the sub-pixel region II and the transparent region III on the substrate 510. The first and second active layers 530 and 535 may be provided using an oxide semiconductor, an inorganic semiconductor, an organic semiconductor, etc., for example. In an exemplary embodiment, the substrate 510 may be provided using quartz, synthetic quartz, calcium fluoride, fluoride-doping quartz, a sodalime glass, a non-alkali glass etc., for example. In an alternative exemplary embodiment, a buffer layer may be disposed on the substrate 510. The buffer layer may be disposed on the entire substrate 510. The buffer layer may prevent the diffusion of metal atoms and/or impurities from the substrate 510. A gate insulating layer 550 may be disposed on the substrate 510. The gate insulating layer 550 may cover the first and second active layers 530 and 535, and may be entirely provided in the sub-pixel region II and the transparent region III on the substrate 510. In an exemplary embodiment, the gate insulating layer 550 may be provided using a silicon compound, a metal oxide, etc., for example. First and second gate electrodes 570 and 575 may be disposed on the gate insulating layer 550 under which the first and second active layers 530 and 535 are located, respectively. In an exemplary embodiment, each of the first and second gate electrodes 570 and 575 may be provided using metal, alloy, metal nitride, conductive metal oxide, transparent conductive materials, etc., for example.

Figure 6:
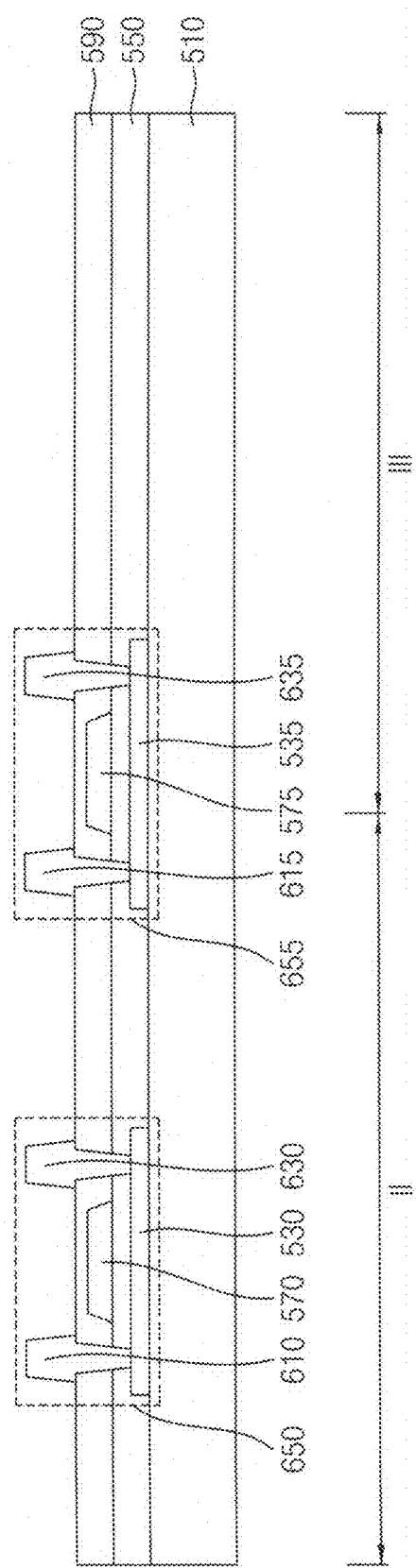

Referring to FIG. 6, an insulating interlayer 590 may be disposed on the first and second gate electrodes 570 and 575. The insulating interlayer 590 may cover each of the first and second gate electrodes 570 and 575, and may be entirely provided in the sub-pixel region II and the transparent region III on the gate insulation layer 550. In an exemplary embodiment, the insulating interlayer 590 may be provided using a silicon compound, a metal oxide, etc., for example. First and second source electrodes 610 and 615 and the first and second drain electrodes 630 and 635 may be disposed on the insulating interlayer 590. Each of the first and second source electrodes 610 and 615 may contact a first side (e.g., a first portion) of each of the first and second active layers 530 and 535 via a contact hole defined by removing a portion of the gate insulating layer 550 and the insulating interlayer 590. Each of the first and second drain electrodes 630 and 635 may contact a second side (e.g., second portion) of each of the first and second active layers 530 and 535 via a contact hole defined by removing a portion of the gate insulating layer 550 and the insulating interlayer 590. Here, the second portion of the second active layer 535 may overlap the transparent region III, and the second drain electrode 635 may be provided in the transparent region III. In an exemplary embodiment, each of the first and second source electrodes 610 and 615 and each of the first and second drain electrodes 630 and 635 may be provided using a metal, an alloy, metal nitride, conductive metal oxide, transparent conductive materials, etc., for example. These may be used alone or in a suitable combination thereof. Accordingly, a first semiconductor element 650 including the first active layer 530, the first gate electrode 570, the first source electrode 610, and the first drain electrode 630 may be provided. In addition, a second semiconductor element 655 including the second active layer 535, the second gate electrode 575, the second source electrode 615, and the second drain electrode 635 may be provided.

Figure 7:
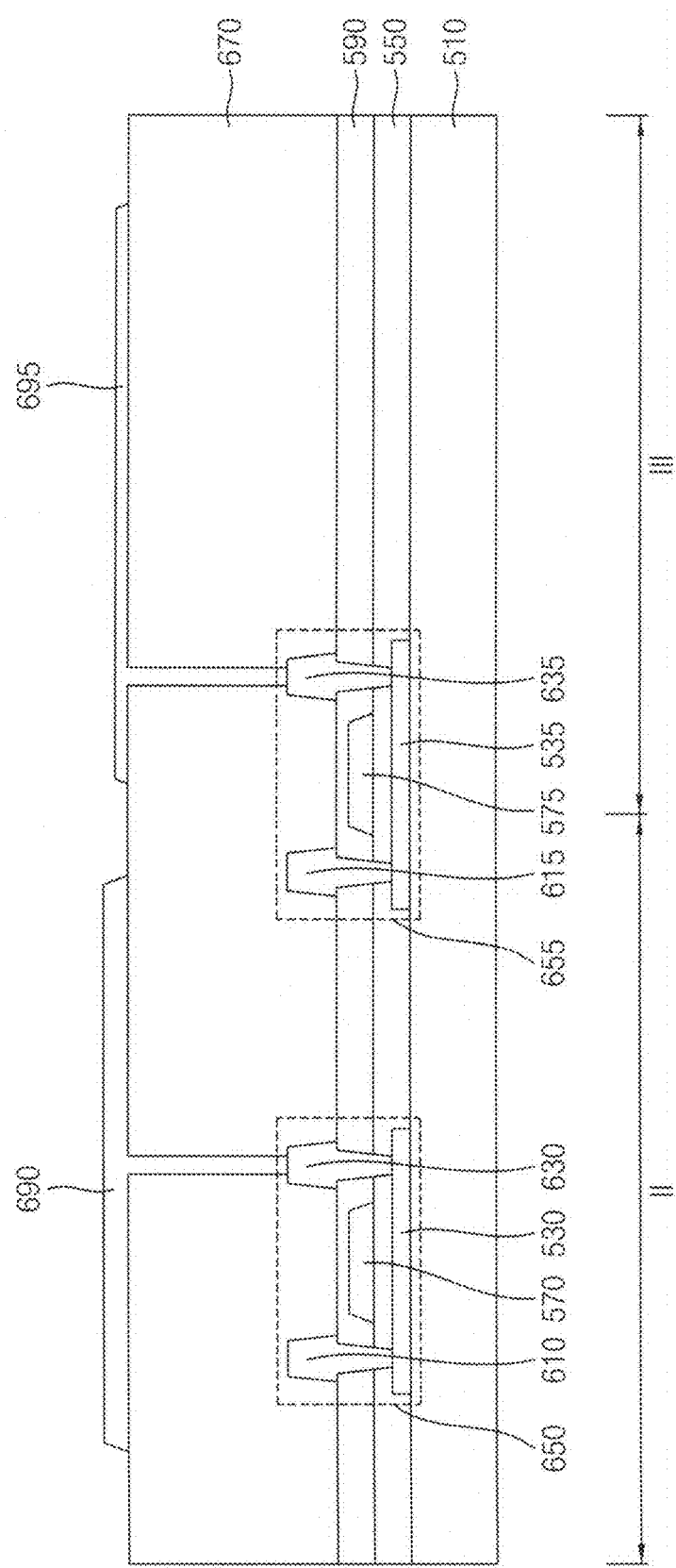

Referring to FIG. 7, a planarization layer 670 may be disposed on the insulating interlayer 590. The planarization layer 670 may cover the first and second source electrodes 610 and 615 and the first and second drain electrodes 630 and 635, and may be entirely provided in the sub-pixel region II and the transparent region III on the substrate 510. A first contact hole located in the sub-pixel region II and a second contact hole located in the transparent region III may be defined in the planarization layer 670. The planarization layer 670 may have a high thickness to sufficiently cover the first and second source and first and second drain electrodes 610, 615, 630, and 635. In this case, the planarization layer 670 may have a substantially flat upper surface, and a planarization process may be further performed on the planarization layer 670 to implement the flat upper surface of the planarization layer 670. In an exemplary embodiment, the planarization layer 670 may be provided using silicon compound, metal oxide, organic materials, etc., for example.

First and second lower electrodes 690 and 695 may be disposed on the planarization layer 670. The first lower electrode 690 may be provided in the sub-pixel region II on the substrate 510, and may have a first thickness. The first lower electrode 690 may contact the first drain electrode 630 by defining the first contact hole of the planarization layer 670. In an exemplary embodiment, the first lower electrode 690 may have a multilayer structure. As illustrated in FIG. 3, the multilayer structure may include first, second, and third electrode layers. The first electrode layer may be provided in the sub-pixel region II on the planarization layer 670, and the second electrode layer and the third electrode layer may be sequentially disposed on the first electrode layer. Here, the first electrode layer and the third electrode layer may be provided using the substantially same materials, and the second electrode layer may be interposed between the first electrode layer and the third electrode layer. A thickness of each of the first and third electrode layers may be substantially less than that of the second electrode layer, and a thickness of the first electrode layer may be substantially the same as that of the third electrode layer. The second electrode layer may be substantially opaque. In an exemplary embodiment, the second electrode layer may be provided using Au, Ag, Al, Pt, Ni, Ti, Pd, Mg, Ca, Li, Cr, Ta, W, Cu, Mo, Sc, Nd, Ir, etc., for example. These may be used alone or in a suitable combination thereof. Each of the first electrode layer and the third electrode layer may include transparent conductive materials, etc. In an exemplary embodiment, each of the first electrode layer and the third electrode layer may be transparent, for example. Each of the first electrode layer and the third electrode layer may be provided using transparent conductive materials, etc.

The second lower electrode 695 may be provided in the transparent region III on the substrate 510, and may have a second thickness. The second thickness of the second lower electrode 695 may be less than the first thickness of the first lower electrode 690. The second lower electrode 695 may contact the second drain electrode 635 by defining the second contact hole of the planarization layer 670. In an exemplary embodiment, as illustrated in FIG. 4, the second lower electrode 695 may have a multilayer structure, for example. The multilayer structure may include fourth and fifth electrode layers. The fourth electrode layer may be provided in the transparent region III on the planarization layer 670, and the fifth electrode layer may be disposed on the fourth electrode layer. Here, the fourth electrode layer and the fifth electrode layer may be provided using the substantially same materials, and a thickness of each of the fourth and fifth electrode layers may be the substantially same. In exemplary embodiments, the first electrode layer and the fourth electrode layer may be simultaneously provided, and the third electrode layer and the fifth electrode layer may be simultaneously provided. In an exemplary embodiment, a first preliminary electrode layer may be disposed on the entire planarization layer 670, for example. After the first preliminary electrode layer is provided, the first electrode layer and the fourth electrode layer may be provided by removing a portion of the first preliminary electrode layer. After the first electrode layer and the fourth electrode layer are provided, the second electrode layer may be disposed on the first electrode layer. After the second electrode layer is provided, a preliminary second electrode layer may be entirely disposed on the second electrode, the fourth electrode layer, and the planarization layer 670. After the preliminary second electrode layer is provided, the third electrode layer and the fifth electrode layer may be provided by removing a portion of the preliminary second electrode layer. Thus, the fourth and fifth electrode layers and the first and third electrode layers may be the substantially same materials. Each of the fourth and fifth electrode layers may be substantially transparent. In an exemplary embodiment, each of the fourth and fifth electrode layers may include transparent conductive materials, etc., for example.

Figure 8:
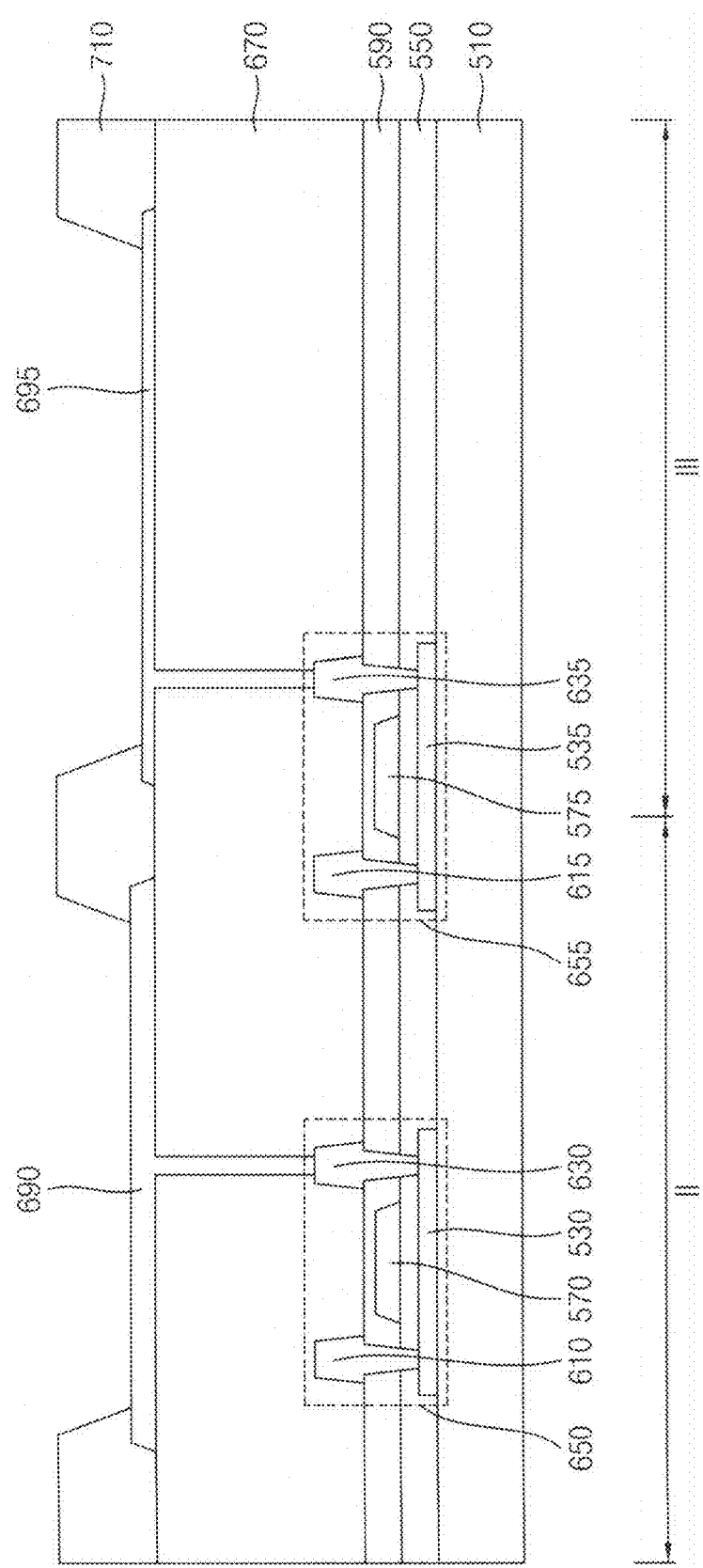
Figure 9:
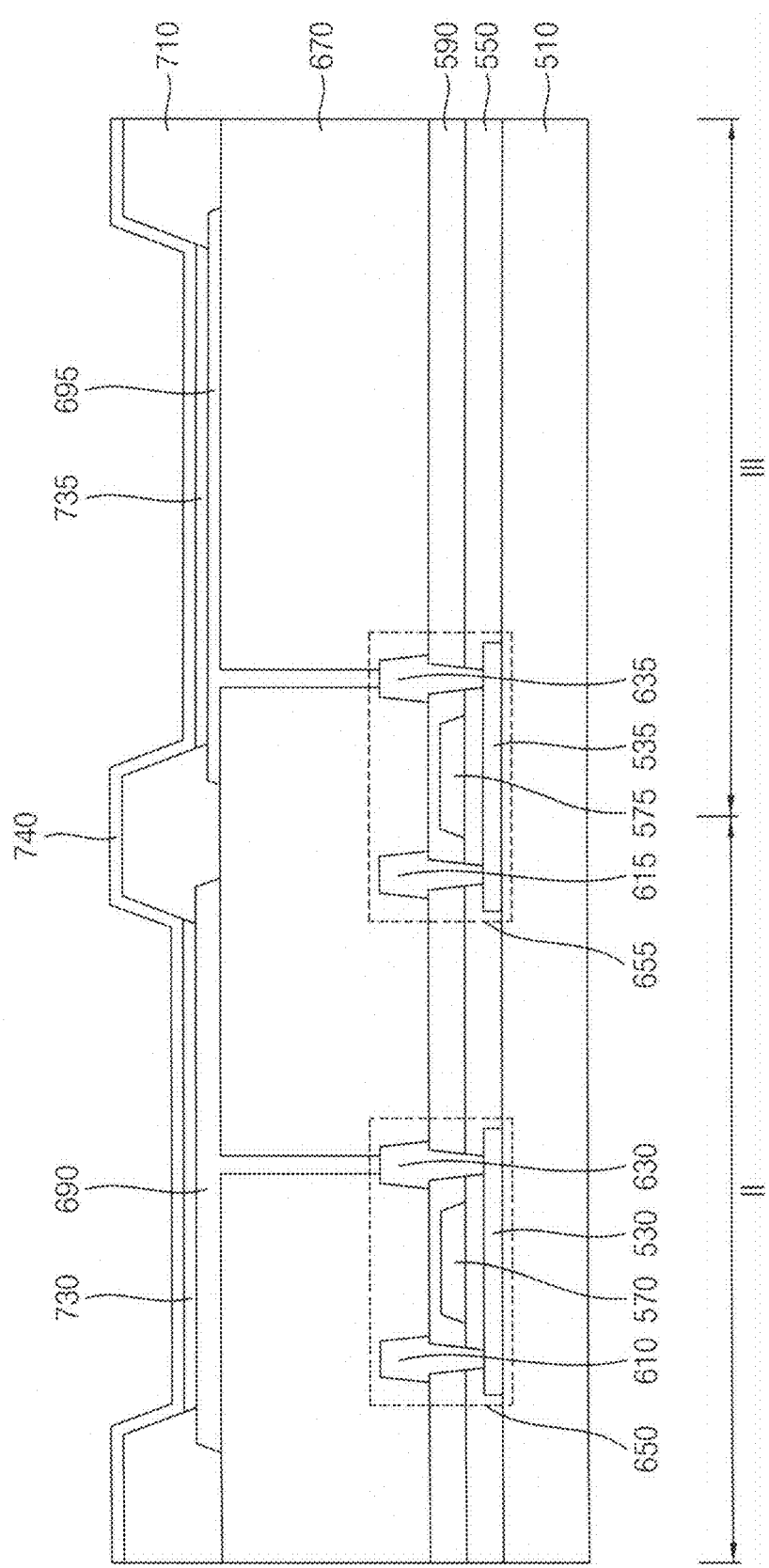

Referring to FIGS. 8 and 9, a pixel defining layer 710 may be disposed on the planarization layer 670 to expose a portion of each of the first and second lower electrodes 690 and 695. In an exemplary embodiment, the pixel defining layer 710 may cover both lateral portions of the first lower electrode 690 and both lateral portions of the second lower electrode 695, for example. The second semiconductor element 655 may be located under the pixel defining layer 710. At least a portion of the second semiconductor element 655 may overlap the second light emitting layer 635. In an exemplary embodiment, the second semiconductor element 655 may be disposed under the pixel defining layer 710 that is interposed between the first lower electrode 690 and the second lower electrode 695, for example. The pixel defining layer 710 may be provided using organic materials or inorganic materials.

A first light emitting layer 730 may be provided in a portion where the portion of the first lower electrode 690 is exposed. The first light emitting layer 730 may be provided using at least one of light emitting materials capable of generating lights of different colors (e.g., a light of a red color, a light of a blue color, and a light of a green color, etc.) according to first, second, and third sub-pixels of FIG. 1.

A second light emitting layer 735 may be provided in a portion where the portion of the second lower electrode 695 is exposed. The second light emitting layer 735 may emit a light of a white color according to fourth sub-pixels of FIG. 1. The second light emitting layer 735 may have a tandem structure to emit a light of a white color. In an exemplary embodiment, the second light emitting layer 735 may include a light emitting layer of a red color, a light emitting layer of a green color, and a light emitting layer of a blue color, and charge generation layers ("CGL") may be interposed between a light emitting layer of the red color and a light emitting layer of the green color and between a light emitting layer of the green color and a light emitting layer of the blue color, for example. In an exemplary embodiment, a light emitting layer of the red color, a first CGL, a light emitting layer of the green color, a second CGL, a light emitting layer of the blue color may be sequentially disposed on the second lower electrode 695, for example. In exemplary embodiments, the second light emitting layer 735 may generally generate a light of a white color by mixing a plurality of light emitting materials capable of generating lights of different colors such as a light of a red color, a light of a green color, a light of a blue color, etc. In an exemplary embodiment, the second light emitting layer 735 may generate a light of a blue color and a light of a yellow-green color by using a blue fluorescent material and a yellow-green phosphor material, and a light of a white color may be generated in a suitable mix thereof, for example. In addition, various colors of a light may be generated by controlling a mixing ratio of the light emitting materials. In an exemplary embodiment, the light emitting materials may emit a light of a yellow color, a light of a violet color a light of a sky-blue color, etc., for example. In an alternative exemplary embodiment, the second light emitting layer 735 may emit a light of a red color, a light of a green color, or a light of a blue color such as the first light emitting layer 330.

An upper electrode 740 may be entirely disposed on the pixel defining layer 710 and the first and second light emitting layers 730 and 735. The upper electrode 740 may cover the pixel defining layer 710 and the first and second light emitting layers 730 and 735 in the sub-pixel region II and the transparent region III. In an exemplary embodiment, the upper electrode 740 may be provided using a metal, a metal alloy, metal nitride, conductive metal oxide, transparent conductive materials, etc., for example. These may be used alone or in a suitable combination thereof.

Figure 10:
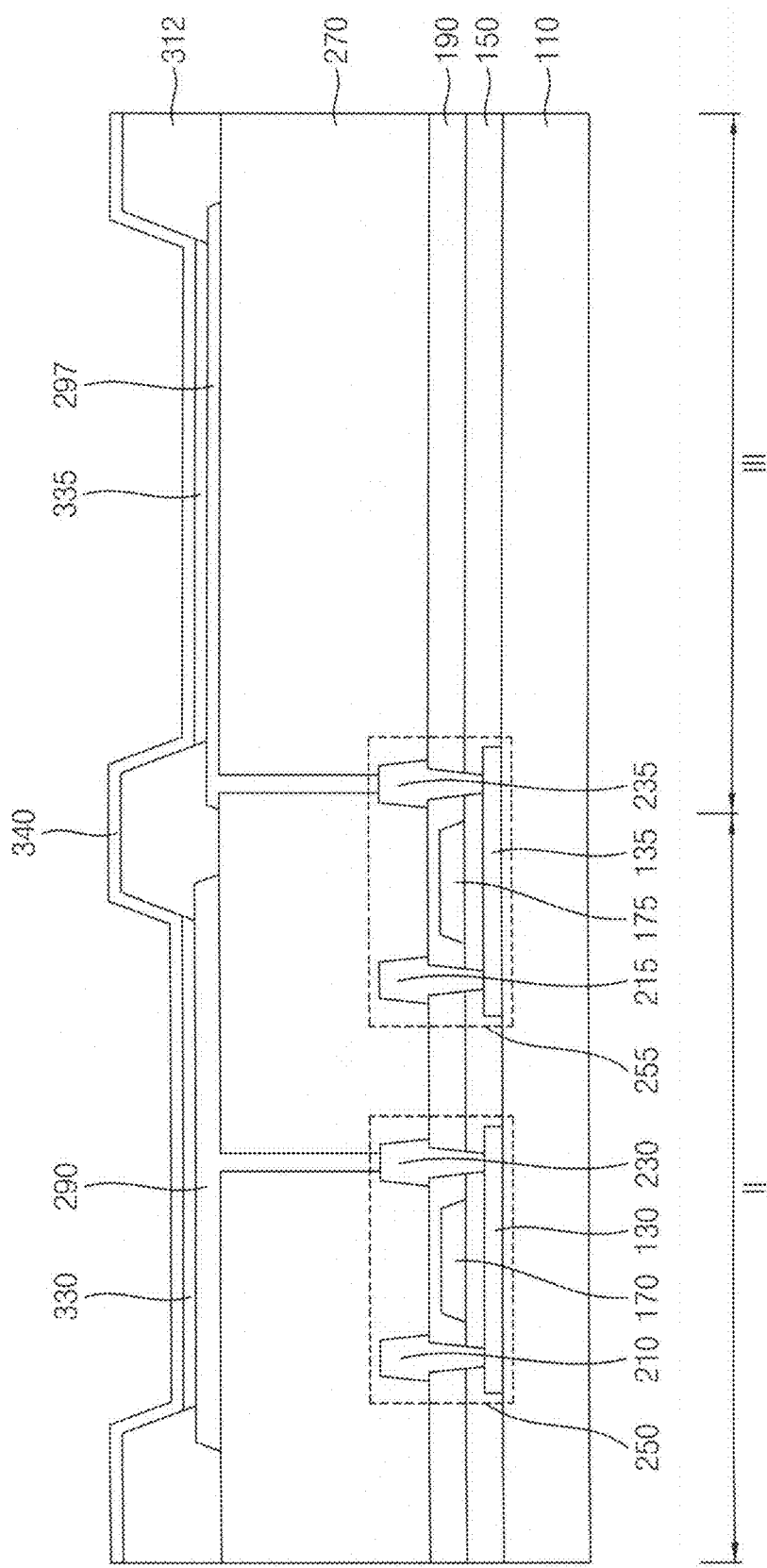
FIG. 10 is a cross-sectional view illustrating exemplary embodiments of an OLED device in accordance with the invention.

FIG. 10 is a cross-sectional view illustrating an OLED device in accordance with exemplary embodiments. An OLED device illustrated in FIG. 10 may have a configuration substantially the same as or similar to that of an OLED device 100 described with reference to FIG. 2 except a position of a second semiconductor element 255. In FIG. 10, detailed descriptions for elements, which are substantially the same as or similar to the elements described with reference to FIG. 2, will be omitted.

Referring to FIG. 10, an OLED device may include a substrate 110, a gate insulating layer 150, an insulating interlayer 190, a planarization layer 270, first and second light emitting structures, a pixel defining layer 312, etc. Here, the first and second light emitting structures may include first and second semiconductor elements 250 and 255, first and second lower electrodes 290 and 297, first and second light emitting layers 330 and 335, respectively, and commonly include an upper electrode 340. The first and second semiconductor elements 250 and 255 may include first and second active layers 130 and 135, first and second gate electrodes 170 and 175, first and second source electrodes 210 and 215, and first and second drain electrodes 230 and 235, respectively.

As described above, the OLED device may include a plurality of pixel regions. One pixel region among a plurality of the pixel regions may have a sub-pixel region II and a transparent region III.

In the sub-pixel region II, the first semiconductor element 250, the first lower electrode 290, the first light emitting layer 330, etc., may be disposed. In the transparent region III, the second lower electrode 297, the second light emitting layer 335, etc., may be disposed. The upper electrode 340 may be entirely disposed in the sub-pixel region II and the transparent region III, and the second semiconductor element 255 may be disposed in a portion of the sub-pixel region II and a portion of the transparent region III. In exemplary embodiments, the second semiconductor element 255 may be disposed under the pixel defining layer 312 that is interposed between the first light emitting layer 330 and the second light emitting layer 335.

A display image may be displayed in the sub-pixel region II, and a light may be emitted by the second light emitting layer 335 in the transparent region III. However, the second light emitting layer 335 and the second lower electrode 297 may be substantially transparent. Accordingly, when the second semiconductor element 255 is not activated (e.g., a turned-off state of the second light emitting layer 335), an image of an object that is located at the back of the OLED device may be transmitted in the transparent region III. As the OLED device includes the transparent region III, the OLED device may serve as a transparent display device.

The planarization layer 270 may be disposed on the first and second source electrodes 210 and 215 and the first and second drain electrodes 230 and 235 (e.g., on the first semiconductor element 250 and the second semiconductor element 255). In exemplary embodiments, a first contact hole located in the sub-pixel region II and a second contact hole located in the transparent region III may be defined in the planarization layer 270. In an exemplary embodiment, the first contact hole may be located under the first light emitting layer 330, and the second contact hole may be located under the pixel defining layer 312 such that the second contact hole does not overlap the second light emitting layer 335, for example. The first lower electrode 290 may contact the first drain electrode 230 via the first contact hole, and the second lower electrode 297 may contact the second drain electrode 235 via the second contact hole. The planarization layer 270 may cover the first and second source electrodes 210 and 215 and the first and second drain electrodes 230 and 235 in the sub-pixel region II and the transparent region III, and may be disposed on the entire substrate 110. In an exemplary embodiment, the planarization layer 270 may include silicon compound, metal oxide, organic materials, etc., for example.

The first and second lower electrodes 290 and 297 may be disposed on the planarization layer 270. The first lower electrode 290 may be disposed in the sub-pixel region II on the substrate 110, and may have a first thickness. The first lower electrode 290 may contact the first drain electrode 230 by defining the first contact hole of the planarization layer 270. The second lower electrode 297 may be disposed in the transparent region III on the substrate 110, and may have a second thickness. The second thickness of the second lower electrode 297 may be less than the first thickness of the first lower electrode 290. The second lower electrode 297 may contact the second drain electrode 235 by defining the second contact hole of the planarization layer 270. In exemplary embodiments, as the second semiconductor element 255 is disposed under the pixel defining layer 312 interposed between the first light emitting layer 330 and the second light emitting layer 335, a transmissivity of ratio of the OLED device may be relatively increased.

Figure 11:
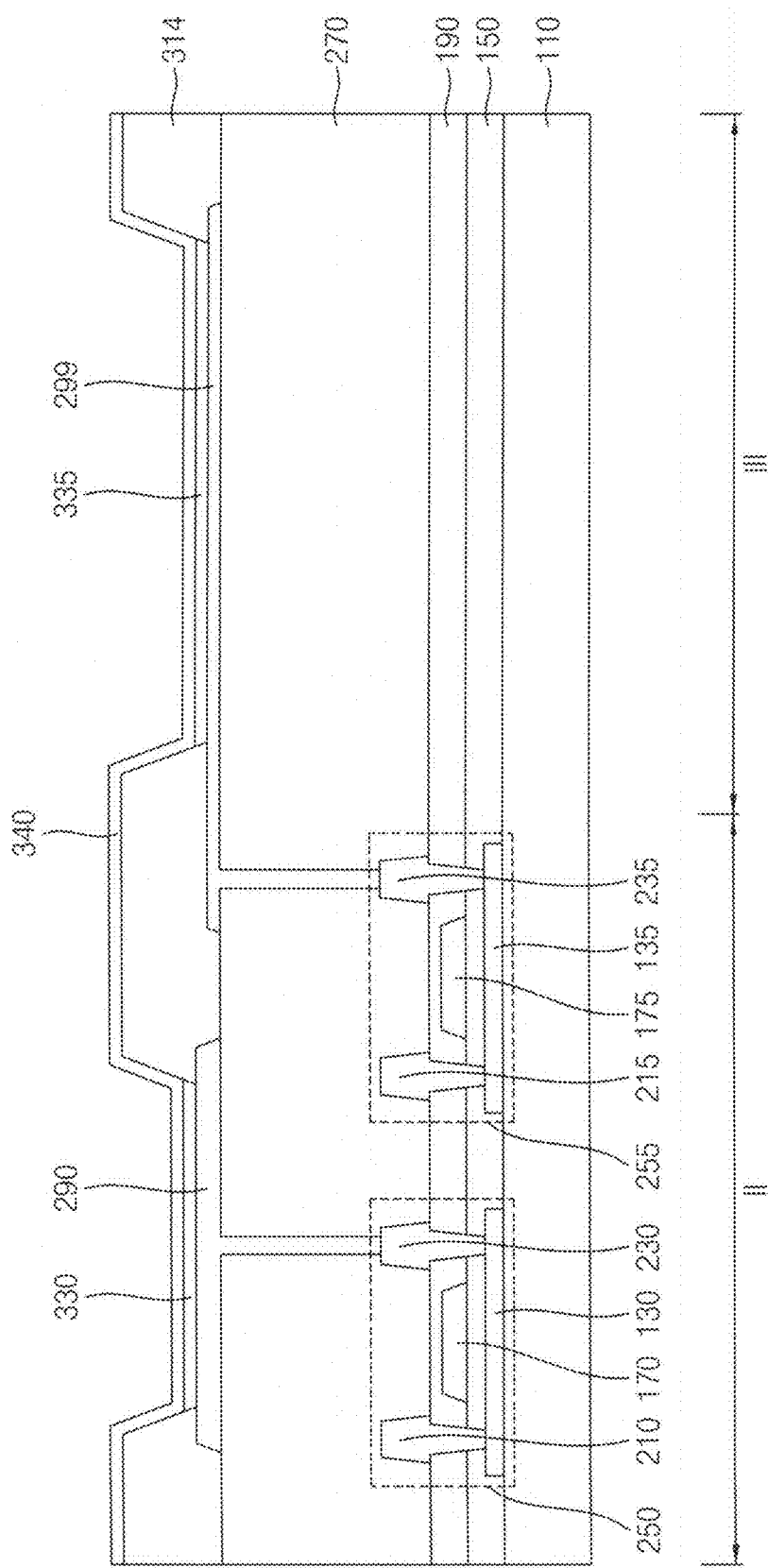
FIG. 11 is a cross-sectional view illustrating exemplary embodiments of an OLED device in accordance with the invention.

FIG. 11 is a cross-sectional view illustrating an OLED device in accordance with exemplary embodiments. An OLED device illustrated in FIG. 11 may have a configuration substantially the same as or similar to that of an OLED device 100 described with reference to FIG. 2 except a position of a second semiconductor element 255. In FIG. 11, detailed descriptions for elements, which are substantially the same as or similar to the elements described with reference to FIG. 2, will be omitted.

Referring to FIG. 11, an OLED device may include a substrate 110, a gate insulating layer 150, an insulating interlayer 190, a planarization layer 270, first and second light emitting structures, a pixel defining layer 314, etc. Here, the first and second light emitting structures may include first and second semiconductor elements 250 and 255, first and second lower electrodes 290 and 299, first and second light emitting layers 330 and 335, respectively, and may commonly include an upper electrode 340. The first and second semiconductor elements 250 and 255 may include first and second active layers 130 and 135, first and second gate electrodes 170 and 175, first and second source electrodes 210 and 215, and first and second drain electrodes 230 and 235, respectively.

As described above, the OLED device may include a plurality of pixel regions. One pixel region among a plurality of the pixel regions may have a sub-pixel region II and a transparent region III.

In the sub-pixel region II, the first and second semiconductor elements 250 and 255, the first lower electrode 290, the first light emitting layer 330, etc., may be disposed. In the transparent region III, the second lower electrode 299, the second light emitting layer 335, etc., may be disposed. The upper electrode 340 may be entirely disposed in the sub-pixel region II and the transparent region III. In exemplary embodiments, the second semiconductor element 255 may be disposed in the sub-pixel region II under the pixel defining layer 314 that is interposed between the first light emitting layer 330 and the second light emitting layer 335.

A display image may be displayed in the sub-pixel region II, and a light may be emitted by the second light emitting layer 335 in the transparent region III. However, the second light emitting layer 335 and the second lower electrode 299 may be substantially transparent. Accordingly, when the second semiconductor element 255 is not activated, an image of an object that is located at the back of the OLED device may be transmitted in the transparent region III. As the OLED device includes the transparent region III, the OLED device may serve as a transparent display device.

The first semiconductor element 250 may include the first active layer 130, the first gate electrode 170, the first source electrode 210, and the first drain electrode 230, and may be disposed in the sub-pixel region II on the substrate 110.

In exemplary embodiments, the second semiconductor element 255 may include the second active layer 135, the second gate electrode 175, the second source electrode 215, and the second drain electrode 235, and may be disposed in the sub-pixel region II on the substrate 110. That is, at least a portion of the second semiconductor element 255 may not overlap the second light emitting layer 335. In an exemplary embodiment, the second semiconductor element 255 may be disposed in the sub-pixel region II under the pixel defining layer 314 that is interposed between the first light emitting layer 330 and the second light emitting layer 335, for example.

The planarization layer 270 may be disposed on the first and second source electrodes 210 and 215 and the first and second drain electrodes 230 and 235 (e.g., on the first semiconductor element 250 and the second semiconductor element 255). In exemplary embodiments, a first contact hole located in the sub-pixel region II and a second contact hole located in the transparent region III may be defined in the planarization layer 270. In an exemplary embodiment, the first contact hole may be located under the first light emitting layer 330, and the second contact hole may be located in the sub-pixel region II under the pixel defining layer 314 such that the second contact hole does not overlap the second light emitting layer 335, for example. The first lower electrode 290 may contact the first drain electrode 230 via the first contact hole, and the second lower electrode 299 may contact the second drain electrode 235 via the second contact hole. In an exemplary embodiment, the planarization layer 270 may include silicon compound, metal oxide, organic materials, etc., for example.

The first and second lower electrodes 290 and 299 may be disposed on the planarization layer 270. The first lower electrode 290 may be disposed in the sub-pixel region II on the substrate 110, and may have a first thickness. The first lower electrode 290 may contact the first drain electrode 230 by defining the first contact hole of the planarization layer 270. The second lower electrode 299 may extend in a direction from the transparent region III into the sub-pixel region II on the substrate 110, and the second lower electrode 299 may be disposed in a portion of the sub-pixel region II and the transparent region III. In addition, the second lower electrode 299 may have a second thickness. The second thickness of the second lower electrode 299 may be less than the first thickness of the first lower electrode 290. The second lower electrode 299 may contact the second drain electrode 235 by defining the second contact hole of the planarization layer 270. In exemplary embodiments, as the second semiconductor element 255 is disposed in the sub-pixel region II under the pixel defining layer 314 interposed between the first light emitting layer 330 and the second light emitting layer 335, a transmissivity of ratio of the OLED device may be relatively increased.

The invention may be applied to various display devices including an OLED device. In an exemplary embodiment, the invention may be applied to vehicle-display device, a ship-display device, an aircraft-display device, portable communication devices, display devices for display or for information transfer, a medical-display device, etc., for example.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting display device, comprising:
    a substrate including a sub-pixel region and a transparent region, the sub-pixel region and the transparent region being separate from each other and non-inclusive of the other;
    a first semiconductor element in the sub-pixel region on the substrate;
    a second semiconductor element overlapping at least a portion of the sub-pixel region on the substrate in a top plan view, the second semiconductor element being spaced apart from the first semiconductor element;
    a first lower electrode in the sub-pixel region on the first semiconductor element, the first lower electrode being electrically connected to the first semiconductor element, the first lower electrode including:
        a first electrode layer;
        a second electrode layer on the first electrode layer; and
        a third electrode layer on the second electrode layer;
    a second lower electrode in the transparent region on the substrate, the second lower electrode being electrically connected to the second semiconductor element, the second lower electrode having a thickness which is less than a thickness of the first lower electrode, the second lower electrode which transmits a light, the second lower electrode consists of:
        a fourth electrode layer; and
        a fifth electrode layer on the fourth electrode layer;
    a first light emitting layer on the first lower electrode;
    a second light emitting layer on the second lower electrode; and
    an upper electrode on the first and second light emitting layers;
    wherein the first electrode layer and the fourth electrode layer are disposed on a same layer, and the fourth electrode layer is in direct contact with the fifth electrode layer,
    wherein the first semiconductor element includes a first source electrode and a first drain electrode, and the first lower electrode overlaps the first source electrode and an entirety of the first drain electrode,
    wherein the second semiconductor element includes a second source electrode and a second drain electrode, and the second lower electrode overlaps an entirety of the second drain electrode and does not overlap the second source electrode, and
    wherein the first lower electrode overlaps the second source electrode.

2. The organic light emitting display device of claim 1, wherein the first semiconductor element includes:
    a first active layer in the sub-pixel region on the substrate;
    a first gate electrode on the first active layer;
    a first source electrode which contacts a first portion of the first active layer, the first source electrode being on the first gate electrode; and
    a first drain electrode which contacts a second portion of the first active layer, the first drain electrode being on the first gate electrode.

3. The organic light emitting display device of claim 2, wherein the second semiconductor element includes:
    a second active layer on the substrate;
    a second gate electrode on the second active layer;
    a second source electrode which contacts a first portion of the second active layer, the second source electrode being on the second gate electrode; and
    the drain electrode is a second drain electrode which contacts a second portion of the second active layer, the second drain electrode being on the second gate electrode,
    wherein a portion of the second semiconductor element overlaps the transparent region.

4. The organic light emitting display device of claim 3, wherein the second light emitting layer includes an organic emission layer, and at least a portion of the second semiconductor element overlaps the organic emission layer of the second light emitting layer.

5. The organic light emitting display device of claim 3, wherein the second light emitting layer includes an organic emission layer, and the second semiconductor element does not overlap the organic emission layer of the second light emitting layer.

6. The organic light emitting display device of claim 3, wherein the second portion of the second active layer overlaps the transparent region, and the second drain electrode is disposed in the transparent region.

7. The organic light emitting display device of claim 3, further comprising:
    a planarization layer on the first and second semiconductor elements; and
    a pixel defining layer on the planarization layer, the pixel defining layer covering both lateral portions of the first lower electrode and both lateral portions of the second lower electrode.

8. The organic light emitting display device of claim 7, wherein a first contact hole and a second contact hole are defined in the planarization layer, and
    wherein the first lower electrode contacts the first drain electrode via the first contact hole, and the second lower electrode contacts the second drain electrode via the second contact hole.

9. The organic light emitting display device of claim 8, wherein the second light emitting layer includes an organic emission layer, and the second contact hole is located under the organic emission layer of the second light emitting layer.

10. The organic light emitting display device of claim 8, wherein the second light emitting layer includes an organic emission layer, and the second contact hole is located under the pixel defining layer such that the second contact hole does not overlap the organic emission layer of the second light emitting layer.

11. The organic light emitting display device of claim 3, wherein the second light emitting layer emits a light of a white color.

12. The organic light emitting display device of claim 11, wherein when the second semiconductor element is activated, the second light emitting layer emits the light of the white color, and
    wherein when the second semiconductor element is not activated, an image of an object which is located in a back of the organic light emitting display device is transmitted via the transparent region.

13. The organic light emitting display device of claim 1, wherein the first light emitting layer emits a light in a first direction which is perpendicular to an upper surface of the substrate, and the second light emitting layer emits a light in a second direction which is opposite to the first direction.

14. The organic light emitting display device of claim 1, wherein the first lower electrode reflects a light which is emitted from the first light emitting layer, and the second lower electrode transmits a light which is emitted from the second light emitting layer.

15. The organic light emitting display device of claim 1, wherein a thickness of the first electrode layer is a substantially same as a thickness of the fourth electrode layer, and a thickness of the third electrode layer is a substantially same as a thickness of the fifth electrode layer.

16. A method of manufacturing an organic light emitting display device, the method comprising:
    providing a substrate including a sub-pixel region and a transparent region, the sub-pixel region and the transparent region being separate from each other and non-inclusive of the other;
    forming a first semiconductor element in the sub-pixel region on the substrate;
    forming a second semiconductor element overlapping at least a portion of the sub-pixel region on the substrate in a top plan view, the second semiconductor element being spaced apart from the first semiconductor element;
    forming a first lower electrode, which includes a first electrode layer, a second electrode layer on the first electrode layer, and a third electrode layer on the second electrode layer, in the sub-pixel region on the first semiconductor element;
    forming a second lower electrode, which consists of a fourth electrode layer and a fifth electrode layer on the fourth electrode layer, in the transparent region on the substrate;
    forming a first light emitting layer on the first lower electrode;
    forming a second light emitting layer on the second lower electrode; and
    forming an upper electrode on the first and second light emitting layers,
    wherein the first electrode layer and the fourth electrode layer are simultaneously formed, the third electrode layer and the fifth electrode layer are simultaneously formed,
    wherein the first semiconductor element includes a first source electrode and a first drain electrode, and the first lower electrode overlaps the first source electrode and an entirety of the first drain electrode,
    wherein the second semiconductor element includes a second source electrode and a drain electrode, and the second lower electrode overlaps an entirety of the drain electrode and does not overlap the second source electrode, and
    wherein the first lower electrode overlaps the second source electrode.

17. The method of claim 16, further comprising:
    forming a planarization layer between the first and second semiconductor elements and the first and second lower electrodes.

18. The method of claim 17, wherein the first and fourth electrode layers are in direct contact with the planarization layer.

19. The method of claim 16, wherein the second lower electrode has a thickness which is less than a thickness of the first lower electrode, and the second lower electrode transmits a light.

20. The method of claim 16, wherein the first electrode layer, the third electrode layer, the fourth electrode layer, and the fifth electrode layer include transparent materials, and the second electrode layer includes opaque materials.

* * * * *